United States Patent
DiMarino et al.

(10) Patent No.: US 11,956,914 B2
(45) Date of Patent: Apr. 9, 2024

(54) SEALED INTERFACE POWER MODULE HOUSING

(71) Applicants: VIRGINIA TECH INTELLECTUAL PROPERTIES, INC., Blacksburg, VA (US); University of Nottingham, Nottingham (GB)

(72) Inventors: Christina DiMarino, Arlington, VA (US); Mark Cairnie, Blacksburg, VA (US); Dushan Boroyevich, Alexandria, VA (US); Rolando Burgos, Blacksburg, VA (US); C. Mark Johnson, Nottingham (GB)

(73) Assignees: VIRGINIA TECH INTELLECTUAL PROPERTIES, INC., Blacksburg, VA (US); UNIVERSITY OF NOTTINGHAM, Nottingham (GB)

( * ) Notice: Subject to any disclaimer, the term of this patent is extended or adjusted under 35 U.S.C. 154(b) by 413 days.

(21) Appl. No.: 17/405,653

(22) Filed: Aug. 18, 2021

(65) Prior Publication Data
US 2023/0053718 A1 Feb. 23, 2023

(51) Int. Cl.
*H05K 7/00* (2006.01)
*H05K 1/18* (2006.01)
(Continued)

(52) U.S. Cl.
CPC ........... *H05K 7/1457* (2013.01); *H05K 1/184* (2013.01); *H05K 5/0095* (2013.01)

(58) Field of Classification Search
CPC ..... H05K 7/1457; H05K 1/184; H05K 5/0095
See application file for complete search history.

(56) References Cited

U.S. PATENT DOCUMENTS

| 4,345,300 A * | 8/1982 | Stuckey | ............ H01L 21/67138 361/767 |
| 10,032,732 B1 | 7/2018 | Dimarino et al. | |

(Continued)

OTHER PUBLICATIONS

DiMarino; "Design and Validation of a High-Density 10 KV Silicon Carbide MOSFET Power Module with Reduced Electric Field Strength and Integrated Common-Mode Screen" Dissertation submitted to the faculty of the Virginia Polytechnic Institute and State University in partial fulfillment of the requirements for the degree of Doctor of Philosophy In Electrical Engineering; Jan. 3, 2019—Blacksburg, VA.

*Primary Examiner* — Pete T Lee
(74) *Attorney, Agent, or Firm* — Thomas | Horstemeyer, LLP

(57) ABSTRACT

A number of different sealed interfaces for power modules are described. In one example, a sealed interface includes a printed circuit board including a contact pad for power conduction to a bus bar of the printed circuit board, a semiconductor module including at least one power transistor, a terminal pin electrically coupled to the power module, and a housing for the power module. The housing includes an open terminal aperture that extends through the housing. The printed circuit board is seated upon the open terminal aperture, to close and seal the open terminal aperture, with the contact pad positioned within the open terminal aperture. The terminal pin contacts the contact pad of the printed circuit board within the open terminal aperture, and the open terminal aperture comprises a transitional feature to abate electric field intensity around an interface between the open terminal aperture and the printed circuit board.

20 Claims, 7 Drawing Sheets

(51) Int. Cl.
  *H05K 5/00* (2006.01)
  *H05K 7/14* (2006.01)

(56) References Cited

U.S. PATENT DOCUMENTS

| | | | |
|---|---|---|---|
| 2016/0240452 A1* | 8/2016 | Prajuckamol | H01L 23/049 |
| 2018/0292459 A1* | 10/2018 | Bell | G01R 31/006 |
| 2020/0373254 A1 | 11/2020 | Wang et al. | |

* cited by examiner

SEALED INTERFACE POWER MODULE HOUSING

FEDERALLY SPONSORED RESEARCH STATEMENT

This invention was made with government support under Grant No. 418744 awarded by PowerAmerica. The government has certain rights in the invention.

BACKGROUND

Today, engineers often consider the use of power modules rather than traditional discrete designs, with time to market, size constraints, and reliability being motivating factors. Power modules typically include one or more power semiconductor devices relied upon for power conversion and other applications. The elements are integrated together into a convenient housing or package in the power module. Power modules are often used in high-power equipment, such as in motor drives, power supplies, power converters, and in inverters and power converters for wind turbines, solar power panels, tidal power plants, and electric vehicles.

Today, power modules are designed to incorporate a broad range of different types of transistors, diodes, silicon controlled rectifiers, and other active devices, along with passive devices in various circuit arrangements for different applications. Power modules are typically designed for simplicity in use, with dedicated terminals for exterior electrical connections and heat sinking surfaces to dissipate heat from active devices. Power modules are mechanically and thermally optimized for ease of assembly, long life, and reliable operation. Compared to discrete power semiconductors in discrete packages, power modules are more convenient, provide a higher power density, and are more reliable in many cases.

BRIEF DESCRIPTION OF THE DRAWINGS

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

DETAILED DESCRIPTION

Figure 1:
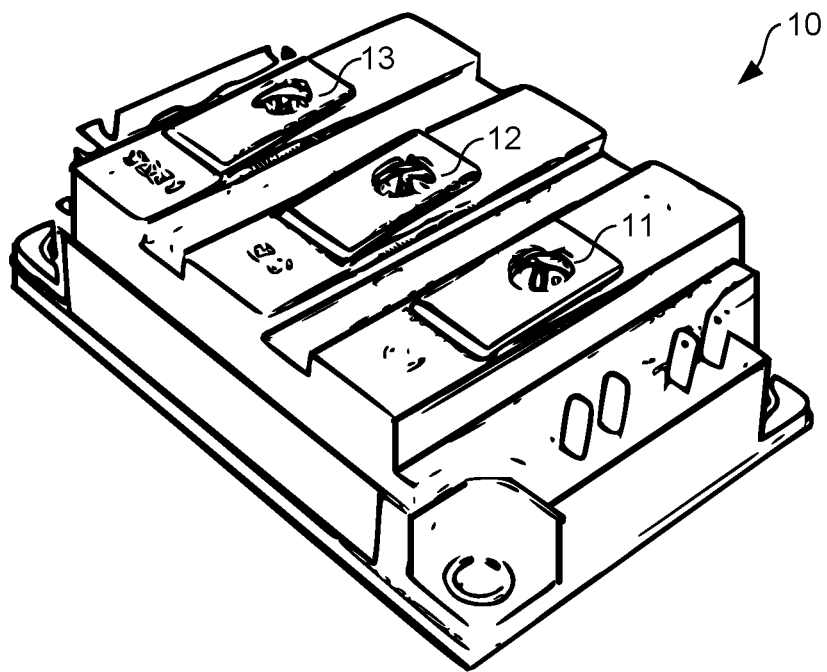
FIG. 1 illustrates an example power module according to various examples described herein.

As noted above, power modules are designed to incorporate a broad range of different types of transistors, diodes, silicon controlled rectifiers, and other active devices, along with passive devices in various circuit arrangements for different applications. Power modules are typically designed for simplicity in use, with dedicated terminals for exterior electrical connections and heat sinking surfaces to dissipate heat from active devices. Power modules are mechanically and thermally optimized for ease of assembly, long life, and reliable operation. Compared to discrete power semiconductors in discrete packages, power modules are more convenient, provide a higher power density, and are more reliable in many cases.

There is a continued emphasis towards the reduction of the size of power modules as industry trends continue towards miniaturization. However, the continued miniaturization of power modules gives rise to certain concerns, including the need for more efficient and effective power dissipation and the need to avoid electrical discharge or arcing between power module terminals, among other concerns.

In the context outlined above, the embodiments described herein are directed to a number of improvements that permit the continued miniaturization of power modules while also avoiding certain problems, like electrical discharge or arcing between power module terminals. A number of different sealed interfaces for power modules are described. In one example, a sealed interface includes a printed circuit board including a contact pad for power conduction to a bus bar of the printed circuit board, a semiconductor module including at least one power transistor, a terminal pin electrically coupled to the power module, and a housing for the power module.

The housing includes an open terminal aperture that extends through the housing. The printed circuit board is seated upon the open terminal aperture, to close and seal the open terminal aperture, with the contact pad positioned within the open terminal aperture. The terminal pin contacts the contact pad of the printed circuit board within the open terminal aperture, and the open terminal aperture includes a transitional feature to abate electric field intensity around an interface between the open terminal aperture and the printed circuit board.

The concepts described herein offer a number of benefits. First, the open terminal aperture includes a planar rim surface, and the printed circuit board can be secured on, with, or to the power module such that the printed circuit board seals and closes the open terminal aperture. The electrical connection for the transfer of power from the power module to the bus bar of the printed circuit board is thus positioned within the open terminal aperture of the power module itself, rather than in an exposed area outside the housing of the power module as with prior designs. The planar rim surface of the open terminal aperture can be raised up or offset from an exterior surface of the housing of the power module, to control the fit between the printed circuit board and the power module.

In other aspects, the printed circuit board can include one or more internal metal layers electrically coupled with the contact pad. The layers extend within the printed circuit board to dislocate or move an intensity of the electric field away from the interface between the open terminal aperture of the power module housing and the printed circuit board. In still other aspects, the open terminal aperture can include an inner wall surface and an outer wall surface. The inner wall surface, the outer wall surface, or both inner and outer wall surfaces can include a transitional feature. As examples, the transitional features can include an angled or curved surface with respect to the planar rim of the open terminal aperture. The transitional features further help to abate or reduce the intensity of the electric field in the region of the open terminal aperture of the power module. With these improvements, among others, the central spacing between the electrical terminals of the power module can be significantly reduced.

Turning to the drawings, FIG. 1 illustrates an example power module 10 according to various examples described herein. The power module 10 is provided as a representative example for the purpose of context and discussion. The power module 10 can include an arrangement of power transistors, such as in a half bridge, full bridge, or other circuit arrangement. The power module 10 includes a number of terminals for making electrical contact with the power module, and terminals 11-13 are shown in FIG. 1. The terminals 11-13 are screw-type terminals, suitable for securing a bus bar, for example, to the power module 10 using screws.

The power module 10 is designed to meet certain creepage and clearance requirements, particularly among the terminals 11-13, based on the voltage rating of the power module 10. For example because the power module 10 can used for switching high voltage potentials on and off, very high potentials can be present across or between two or more of the terminals 11-13. At very high potentials, the dielectric strength of air can breakdown and the high electric field strengths can lead to arcing between one or more of the terminals 11-13. Thus, the power module 10 is designed to have minimum distances or clearances between the terminals 11-13, measured both through the air (e.g., creepage) and across the surface of the housing of the power module 10 (e.g., clearance). These creepage and clearance requirements limit the ability to reduce the size of the power module 10.

Figure 2:
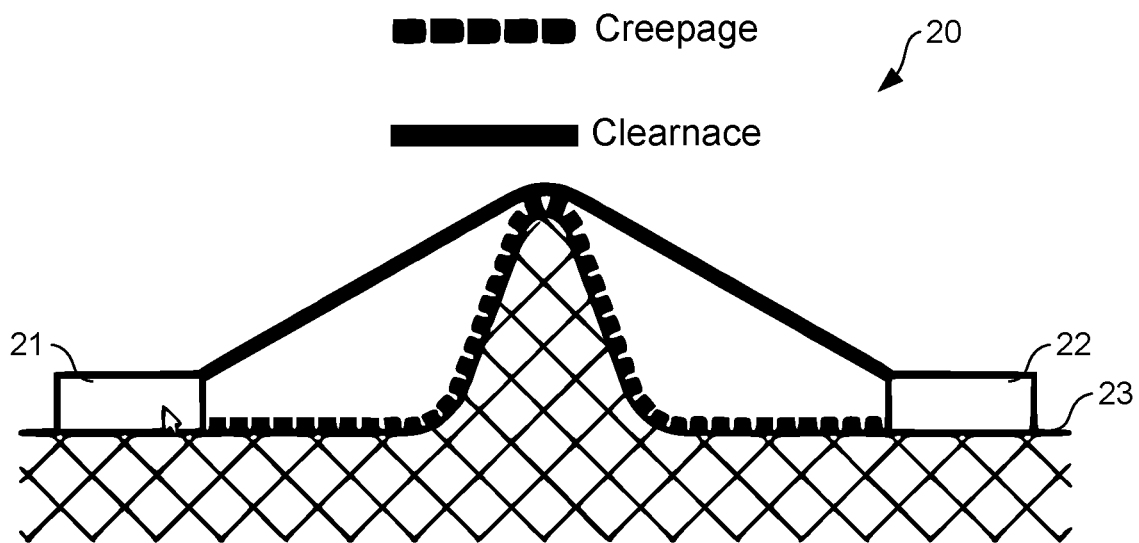
FIG. 2 illustrates the concepts of creepage and clearance over the surface of a power module according to various examples described herein.

FIG. 2 further illustrates the concepts of creepage and clearance over the surface of a power module according to various examples described herein. By definition, clearance between two terminals 21 and 22 can be measured as the shortest distance between the terminals 21 and 22 through the air, as shown in FIG. 2. Additionally, creepage between the terminals 21 and 22 can be measured as the shortest distance along the surface 23 that separates the terminals 21 and 22. Creepage and clearance requirements are defined by international standards for some applications and designs. The concepts described herein provide a new way to reduce the size of power modules and other integrated semiconductor modules, using a design that avoids arcing between high-voltage terminals, even when the terminals are much closer in spacing.

Figure 3A:
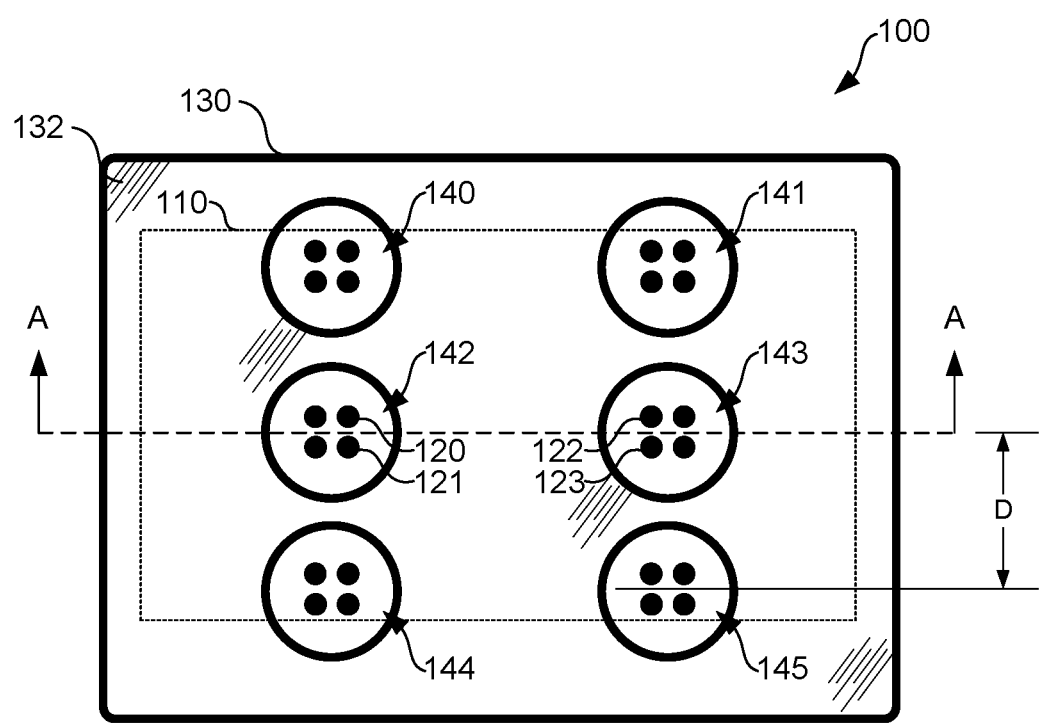
FIG. 3A illustrates a top-down view of a representative power module according to various aspects of the embodiments described herein.

FIG. 3A illustrates a top-down view of a power module 100 according to various aspects of the embodiments described herein. The power module 100 is provided as a representative example to describe the features and benefits of the embodiments. The power module 100 is not necessarily drawn to scale, and one or more of the features shown can be larger or smaller in practice. Additionally one or more of the features shown can be omitted in certain cases, and the power module 100 can also include additional features that are not illustrated in FIG. 3A.

The power module 100 includes a semiconductor module 110, which is outlined using a dashed line in FIG. 3A, a number of terminal pins 120-123, among others, and a housing 130 for the power module 100. The semiconductor module 110 is secured within the housing 130. The terminal pins 120-123, among others, are electrically coupled to the semiconductor module 110 and extend through open terminal apertures 140-145 of the housing 130. The open terminal apertures 140-145 are openings through the housing 130 and permit the terminal pins 120-123 to extend from an enclosed area or space within the housing 130 to an open area or space outside the housing 130. An exterior surface 132 of the housing 130 is also identified in FIG. 3A. The terminal apertures 140-145 are circular in shape in FIG. 3A, but the embodiments are not limited to any shape, size, or style of apertures. In other examples, the terminal apertures 140-145 can be oval, elongated circles, elongated ovals, or other shapes.

As described in further detail below, the power module 100 includes a number of design features that permit the spacing between the open terminal apertures 140-145 and the terminal pins 120-123 to be reduced. For example, testing has shown that the concepts described herein permit the center-to-center spacing "D" between the open terminal apertures 143 and 145 to be as low as about 6 mm, without breakdown or arcing between the terminal pins, using operating voltages for the power module 100 as high as 10 kV. Thus, the concepts described herein can be relied upon to significantly reduce the size of the power module 100 and provide other improvements. The center-to-center spacing "D" is not limited to any particular sizes or dimensions however, and the concepts described herein can be relied upon to help reduce the probability of arcing between terminals of power modules, regardless of the size and operating voltages used.

Figure 3B:
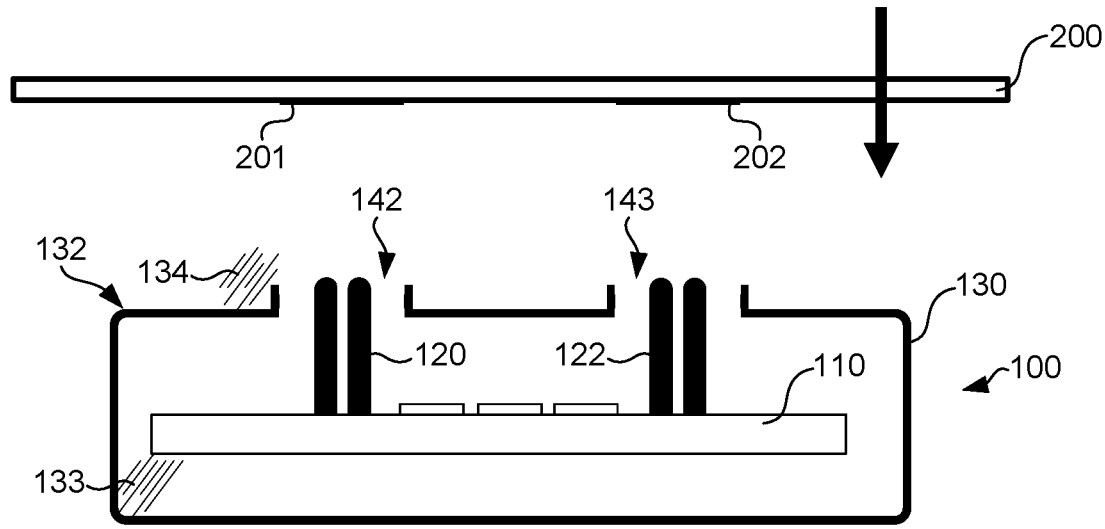
FIG. 3B illustrates the cross-sectional view of the power module designated A-A in FIG. 3A, along with a printed circuit board over the power module, according to various aspects of the embodiments described herein.
Figure 3C:
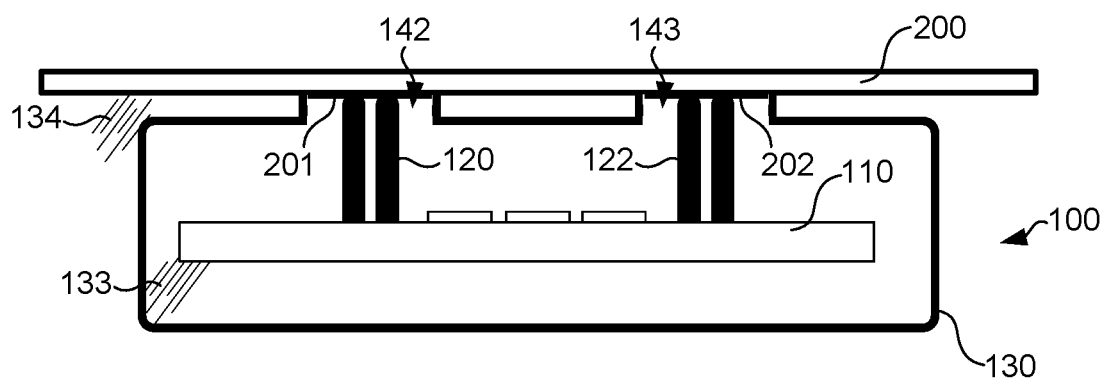
FIG. 3C illustrates the cross-sectional view of the power module designated A-A in FIG. 3A, along with a printed circuit board mounted on the power module, according to various aspects of the embodiments described herein.

FIGS. 3B and 3C illustrate cross-sectional views of the power module 100 designated A-A in FIG. 3A and a printed circuit board (PCB) 200. In FIG. 3B, the PCB 200 is shown over the power module 100, and the PCB 200 is shown mounted on the power module 100 in FIG. 3C. FIGS. 3B and 3C show the semiconductor module 110, the terminal pins 120 and 122, the housing 130, and the open terminal apertures 142 and 143 of the housing 130.

In various embodiments, the semiconductor module 110 can include one or more printed circuit boards or other substrates upon which power transistors, diodes, and other active devices are electrically coupled. The semiconductor module 110 can include an arrangement of power transistors, such as in a half bridge, full bridge, or other circuit arrangement. One or more passive devices can also be mounted on the semiconductor module 110. The semiconductor module 110 is not limited to any particular type, style, or size of module. The semiconductor module 110 can be mounted and secured within the housing 130 in any suitable way and using any suitable means.

The terminal pins 120-123 can be embodied as conductive metal pins that are electrically coupled to surface contacts or traces on the semiconductor module 110. The terminal pins 120-123 can be formed from copper, aluminum, gold, silver, or other conductive metals or materials, or combinations thereof. The terminal pins 120-123 can be soldered or otherwise secured at one end to the surface contacts or traces on the semiconductor module 110, as shown in FIGS. 3A and 3B. The terminal pins 120-123 can also be compressable in some cases, incorporating a spring or other flexible means that permits the terminal pins 120-123 to be compressed, at least in part. Another example of terminal pins secured to a semiconductor module is described below with reference to FIG. 7.

The housing 130 can be embodied as any suitable enclosure for the semiconductor module 110 and the power module 100. The housing 130 can be made in any number of parts or sections, made in any suitable size and shape, and can be formed from plastic by molding or other additive or subtractive manufacturing techniques. In other examples, the housing 130 can be formed from ceramic, laminate, rubber, or other insulating materials. The housing 130 can also incorporate other features not shown in FIGS. 3A and 3B, such as a heat sink or heat slug and mounting holes or apertures. The housing 130 separates an enclosed, internal space 133 within the housing 130 from an open, external space 134 outside of the housing 130. In some cases, the power module 100 can include an encapsulant, such as silicone or other insulating dielectric material, around the semiconductor module 110 and the terminal pins 120-123. This dielectric material can occupy the internal space 133 of the housing 130 around the semiconductor module 110 and the terminal pins 120-123.

The PCB 200 can include two, four, six or more layers of metal, among layers of laminate material. The PCB 200 can be any suitable type and size of PCB among the embodiments. Two contact pads 201 and 202 of the PCB 200 are shown in FIG. 3B. The contact pads 201 and 202 provide exposed conductive surfaces for electrical contact between the ends or tips of the terminal pins 120-123 and metal layers within the PCB 200. The metal layers of the PCB 200 can be relied upon as bus bars for power transfer and are described in further detail below with reference to FIG. 5.

As shown in FIG. 3B, the terminal pins 120-123 extend up from the semiconductor module 110 and into (and through) the open terminal apertures 140-145 of the housing 130. The distal ends of the terminal pins 120-123 are positioned and configured to contact the contact pads 201 and 202 of the PCB 200. Particularly, the PCB 200 can be electrically coupled to the power module 100 in the configuration shown in FIG. 3C, where the PCB 200 is seated upon the open terminal apertures 140-145. The PCB 200 can close and seal off the open terminal apertures 142 and 143 (and all the open terminal apertures 140-145 as shown in FIG. 3C), with the terminal pins 120 and 122 electrically contacting the contact pads 201 and 202. The PCB 200 can be mechanically secured in this arrangement using screws, adhesives, or other fasteners or fastening means. The contact pads 201 and 202 are sized to fit within the open terminal apertures 142 and 143. Thus, the contact pads 201 and 202 do not extend outside of the terminal apertures 142 and 143 when the PCB 200 is seated upon the terminal apertures 140-145 as shown in FIG. 3B.

With the PCB 200 covering the open terminal apertures 140-145, there is no open-air path between the terminal pins 120 and 122 or between the contact pads 201 and 202. Similarly, there is no continuous path between the terminal pins 120 and 122 along the exterior surface 132 of the housing 130 or along an exterior surface of the PCB 200. Thus, the arrangement shown in FIG. 3C can be relied upon as an alternative solution to clearance and creepage requirements at high voltages, and the arrangement helps to avoid arcing between the terminal pins 120 and 122, among others.

Figure 4:
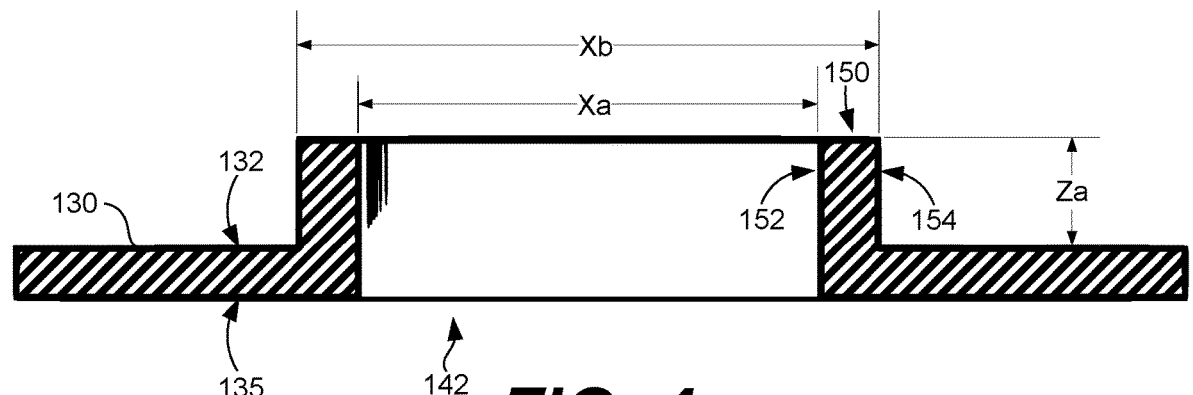
FIG. 4 illustrates a cross-sectional view of an example terminal aperture through a housing for a power module according to various aspects of the embodiments described herein.

FIG. 4 illustrates a cross-sectional view of the open terminal aperture 142 of the power module 100 according to various aspects of the embodiments described herein. The terminal aperture 142 forms an opening through the housing 130, from the interior surface 135 of the housing 130 to the exterior surface 132 of the housing 130. The terminal aperture 142 includes a planar rim surface 150, an inner wall surface 152, and an outer wall surface 154. The planar rim surface 150 is flat, planar, or substantially planar. The planar rim surface 150 extends between the inner wall surface 152 and the outer wall surface 154, both of which extend orthogonal or substantially orthogonal to the planar rim surface 150 in the example shown. The inner diameter of the inner wall surface 152 is identified as the distance "Xa" in FIG. 4. The distance "Xa" can be any suitable size among the embodiments. The outer diameter of the outer wall surface 154 is identified as the distance "Xb" in FIG. 4. The distance "Xb" can be any suitable size among the embodiments.

The planar rim surface 150 is raised or offset from the exterior surface 132 of the housing 130 by the distance Za. In other words, the outer wall surface 154 has a height of Za, measured from the exterior surface 132 of the housing 130 to the planar rim surface 150. The height of the outer wall surface 154 is selected to create an air gap between the exterior surface 132 of the housing 130 and a bottom surface 203 of the PCB 200 (see FIG. 5), when the PCB 200 is shown mounted on the power module 100. The bottom surface 203 of the PCB 200 can be substantially planar, similar to the planar rim surface 150. The air gap helps to abate or relieve an intensity of the electric field (E-field) in the vicinity of the terminal aperture 142, particularly for when the power module 100 is operating at high power. The other terminal apertures 140, 141, and 143-145 of the power module 100 can, preferably, have the same inner wall and outer wall dimensions as the terminal aperture 142 shown in FIG. 4.

In some cases, the terminal aperture 142 can include certain transitional features to help reduce the E-field intensity in the vicinity of the terminal aperture 142. For example, the inner wall surface 152, the outer wall surface 154, or both the inner wall surface 152 and the outer wall surface 154 can include one or more transitional features. As examples, the transitional features can include a curved surface or an angled surface with respect to the planar rim surface 150. Examples of transitional features are described in further detail below with reference to FIGS. 10A-10C.

Figure 5:
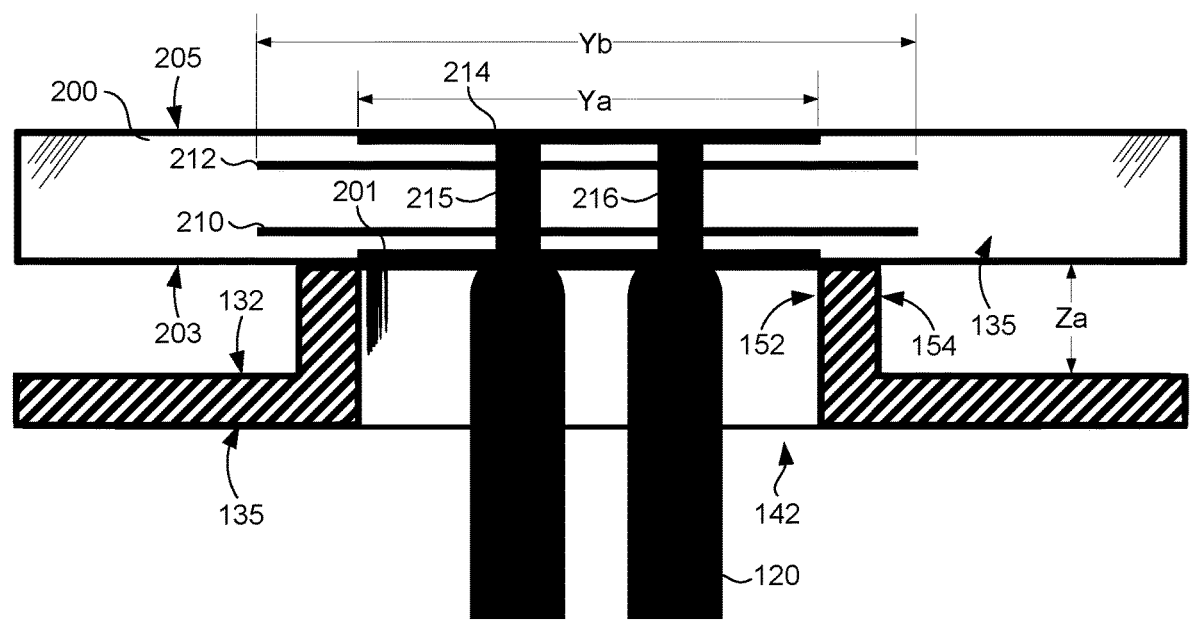
FIG. 5 illustrates a cross-sectional view of an example sealed interface using a terminal aperture, terminal pins, and printed circuit board according to various aspects of the embodiments described herein.

FIG. 5 illustrates a cross-sectional view of an example sealed interface using the terminal aperture 142, the terminal pins 120, and the PCB 200. The PCB 200 is secured over the terminal aperture 142, with the bottom surface 203 of the PCB 200 contacting the entire planar rim surface 150. In some cases, a gasket can be inserted between the bottom surface 203 of the PCB 200 and the planar rim surface 150 of the terminal aperture 142. The gasket can be formed from any suitable material, such as rubber, silicone, or dielectric material.

With the PCB 200 covering the open terminal aperture 142, there is no open-air path between the terminal pin 120 and any other terminal pins of the power module 100. Similarly, there is no continuous path between the terminal pin 120 and any other terminal pins of the power module 100 along the exterior surface 132 of the housing 130. Thus, the arrangement shown in FIG. 3C can be relied upon as an alternative solution to clearance and creepage requirements at high voltages, and the arrangement helps to avoid arcing between the terminal pins 120 and 122, among others.

The PCB 200 is raised or offset from the exterior surface 132 of the housing 130 by the distance Za. The height of the outer wall surface 154 of the housing 130 is selected to create an air gap between the exterior surface 132 of the housing 130 and a bottom surface 203 of the PCB 200, when the PCB 200 is shown mounted on the power module 100 as shown. The air gap helps to relieve an intensity of the E-field in the vicinity of the terminal aperture 142 when the power module 100 is operating at high voltage.

The concepts described herein incorporate other features to relieve, reposition, or relieve and reposition the E-field intensity in the vicinity of the terminal aperture 142. The concepts also relieve and reposition the E-field intensity in the vicinity of the contact pad 201. For example, the PCB 200 includes a number of internal metal layers to help relocate and homogenize the E-field intensity. As shown in FIG. 5, the PCB includes the metal layer 210, the metal layer 212, and the metal layer 214. The metal layers 210 and 212 are internal metal layers of the PCB 200. The metal layer 214 is near a top surface 205 of the PCB, but the metal layer 214 is not exposed as an electrical contact, as the contact pad 201 is exposed. The PCB 200 is illustrated as an example in FIG. 5, and the PCB 200 can include fewer or additional layers of metal. In some cases (or over some regions), one or both of the metal layers 210 and 212 can be relatively thick metal traces within the PCB 200, suitable for use as bus bars for carrying power from the power module 100 to other circuit components (not shown) using the PCB 200. In other examples, the metal layer 214 can be omitted, and the vias 215 and 216 can stop at the metal layer 212.

The metal layers 210, 212, and 214 are electrically coupled to each other and to the contact pad 201 using the vias 215 and 216. Two vias 215 and 216 are shown in FIG. 5, but any number of vias can be used. The cross-sectional width "Ya" of the metal layer 214 is the same as the contact pad 201 in the example shown, and "Ya" is preferably less than "Xa." The cross-sectional width of the metal layer 214 can be different than that of the contact pad 201, however. The cross-sectional width "Yb" of the metal layer 212 is the same as the metal layer 210 in the example shown. The width of the metal layer 212 can be different than the metal layer 210 in other cases. The cross-sectional width "Yb" of the metal layers 210 and 212 is preferably greater than "Xb," and the metal layers 210 and 212 can extend to any distance beyond the outer wall surface 154 of the terminal aperture 142.

Due to the vias 215 and 216, the voltage potential on the terminal pin 120 and the contact pad 201 extends to (i.e., is the same as) the metal layers 210, 212, and 214. Thus, the E-field is drawn away from the inner wall surface 152 of the terminal aperture 142 and the contact pad 201, to a position within the PCB 200. The effective breakdown strength of the power module 100 is further improved due to the additional metal layers within the PCB 200. The dielectric strength of the laminate layers (or other materials) of the PCB 200 is significantly greater than that of air, which is about 3 MV/m.

Figure 6:
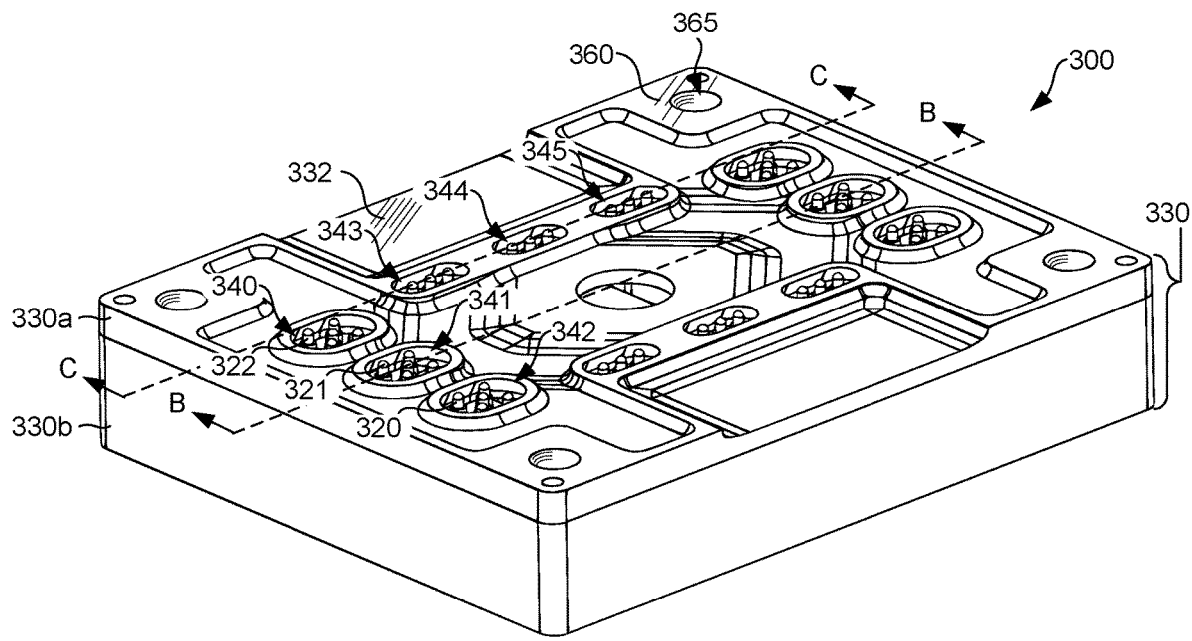
FIG. 6 illustrates a perspective view of a representative power module according to various aspects of the embodiments described herein.

Turning to other examples, FIG. 6 illustrates a perspective view of a representative power module 300 according to various aspects of the embodiments described herein. The power module 300 is provided as another example to describe the features and benefits of the embodiments. The power module 300 is not necessarily drawn to scale, and one or more of the features shown can be larger or smaller in practice. Additionally one or more of the features shown can be omitted in certain cases, and the power module 300 can also include additional features that are not illustrated in FIG. 6. The power module 300 includes a number of design features that permit the spacing between the open terminal apertures 340-345 and the terminal pins 320-322 to be reduced, consistent with the concepts outlined above.

The power module 300 includes a semiconductor module 310 (see FIG. 7), which is secured within a housing 330 of the power module 300, and a number of terminal pins 320-322, among other components. The terminal pins 320-122, among others, are electrically coupled to the semiconductor module 310 and extend through open terminal apertures 340-345 of the housing 330. The housing 330 includes open terminal apertures 340-345, which are openings through the housing 330. The terminal pins 320-322 extend from an enclosed area or space within the housing 330 to an open area or space outside the housing 330. An exterior surface 332 of the housing 330 is also identified in FIG. 6. The terminal apertures 340-345 are shaped as elongated circles in shape in FIG. 6, but the embodiments are not limited to any shape, size, or style of apertures.

The housing 330 is formed from two parts or sections in the example shown, including a housing top 330a and a housing bottom 330b, although the housing 330 can be formed in any number of parts or sections. The housing 330 can be formed from plastic by molding or other additive or subtractive manufacturing techniques. In other examples, the housing 330 can be formed from ceramic, laminate, rubber, or other insulating materials. The housing 330 can also incorporate a heat sink or heat slug in some cases. In some cases, the power module 300 can include an encapsulant, such as silicone or other insulating dielectric material, around the semiconductor module 310 and the terminal pins 320-322 within the housing 330. This dielectric material can occupy the internal space of the housing 330.

Figure 7:
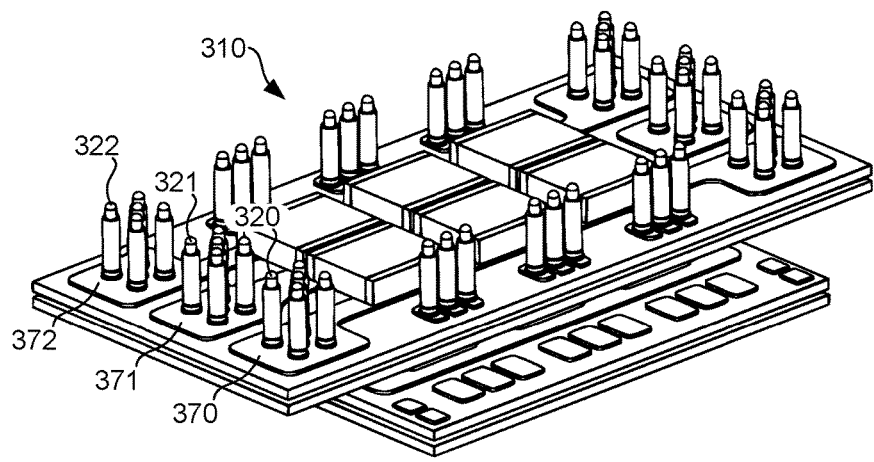
FIG. 7 illustrates a perspective view of a representative semiconductor module according to various aspects of the embodiments described herein.

FIG. 7 illustrates a perspective view of a representative semiconductor module 310 that can be secured within the housing 330 shown in FIG. 6. The semiconductor module 310 can include one or more printed circuit boards or other substrates upon which power transistors, diodes, and other active devices are electrically coupled. The semiconductor module 310 can include an arrangement of power transistors, such as in a half bridge, full bridge, or other circuit arrangement. One or more passive devices can also be mounted on the semiconductor module 310. The semiconductor module 310 is similar to that described in U.S. Pat. No. 10,032,732 (e.g., see FIG. 3 of U.S. Pat. No. 10,032,732), titled "Semiconductor Module Arrangement," which is hereby incorporated herein by reference in its entirety. However, the semiconductor module 310 is not limited to any particular type, style, or size of module. The semiconductor module 310 can be mounted and secured within the housing 330 in any suitable way and using any suitable means.

Similar to the terminal pins 120-123 described above, the terminal pins 320-322 can be embodied as conductive metal pins that are electrically coupled to surface contacts or traces 370-372, respectively, on the semiconductor module 110. The terminal pins 320-322 can be formed from copper, aluminum, gold, silver, or other conductive metals or materials, or combinations thereof. The terminal pins 320-322 can be soldered or otherwise secured at one end to the surface contacts 370-372 on the semiconductor module 310. The terminal pins 320-322 can also be compress-able, incorporating a spring or other flexible means that permits the terminal pins 320-322 to be compressed.

Similar to the examples described above, a PCB can be mounted on and over the housing 330. The PCB can be secured to the housing 330 using screws, bolts, or other fasteners extending through the mounting aperture 365, among others, of the housing 330. The PCB can also rest, in part, upon the housing rim 360, which is elevated or raised from the exterior surface 332. The PCB can seal (i.e., completely cover) the open terminal apertures 340-345 of the housing 330, and contact pads of the PCB can be electrically coupled to the terminal pins 320-322. The PCB can also include internal metal layers similar to those of the PCB 200 shown in FIG. 5.

Figure 8:
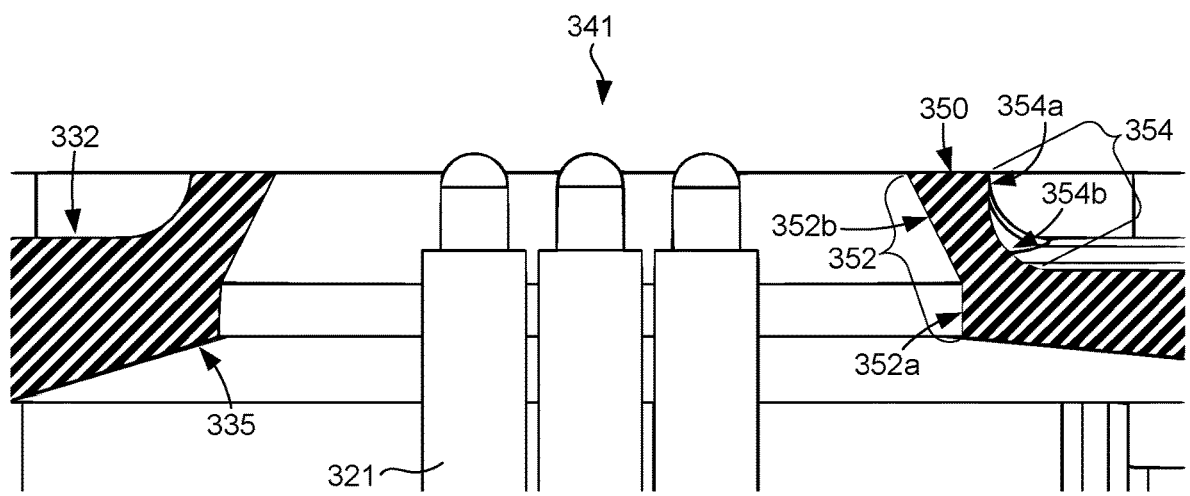
FIG. 8 illustrates a portion of the cross-sectional view of the power module designated B-B in FIG. 6 according to various aspects of the embodiments described herein.

FIG. 8 illustrates a portion of the cross-sectional view of the power module 300 designated B-B in FIG. 6. The open terminal aperture 341 is shown in FIG. 8. The terminal aperture 341 forms an opening through the housing 330, from the interior surface 335 of the housing 330 to the exterior surface 332 of the housing 330. The terminal aperture 341 includes a planar rim surface 350, an inner wall surface 352, and an outer wall surface 354. The planar rim surface 350 is flat, planar, or substantially planar. The planar rim surface 350 extends between the inner wall surface 352 and the outer wall surface 354.

The planar rim surface 350 is raised or offset from the exterior surface 332 of the housing 330. A height of the outer wall surface 354 can be measured from the exterior surface 332 of the housing 330 to the planar rim surface 350. The height of the outer wall surface 354 is selected to create an air gap between the exterior surface 332 of the housing 330 and a bottom surface of a PCB to be mounted on the housing 330. The air gap helps to relieve an intensity of the E-field in the vicinity of the terminal aperture 341 when the power module 300 is operating at high power. The other terminal apertures 340 and 342 of the power module 300 can have the same inner wall and outer wall dimensions as the terminal aperture 341 shown in FIG. 8.

The inner wall surface 352 and the outer wall surface 354 of the terminal aperture 341 also include transitional features to help reduce the E-field intensity in the vicinity of the terminal aperture 341. As shown, the inner wall surface 352 includes a vertical inner surface 352a and an angled inner surface 352b. The vertical inner surface 352a extends perpendicular (i.e., at a 90° or right angle) to the planar rim surface 350, and the angled inner surface 352b extends at an angle (i.e., not perpendicular) to the planar rim surface 350. As examples, the angled inner surface 352b can extend at an angle of between 80° to 60° as compared to the planar rim surface 350, such as at an angle of 80°, 78°, 76°, 74°, 72°, 70°, 68°, 66°, 64°, 62°, or 60°. The angled inner surface 352b can also extend at an angle of less than 60° as compared to the planar rim surface 350 in some cases, and even at an angle of less than 45° in some cases.

The outer wall surface 354 includes a vertical outer surface 354a and a curved outer surface 354b. The vertical outer surface 354a extends perpendicular (i.e., at a 90° or right angle) to the planar rim surface 350. The curved outer surface 354b includes a curved, semi-circular, or arced surface as compared to the vertical outer surface 354a and the planar rim surface 350. The angled inner surface 352b and the curved outer surface 354b help to reduce the intensity of the electric field in the area or region of the open terminal aperture 341.

Figure 9:
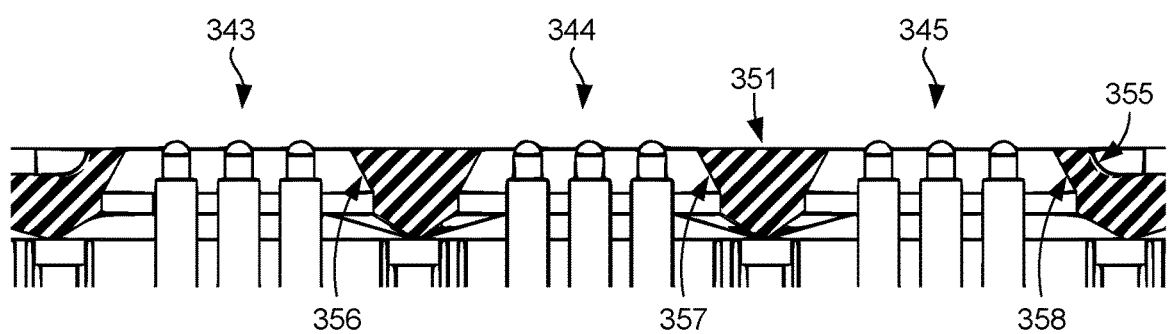
FIG. 9 illustrates a portion of the cross-sectional view of the power module designated C-C in FIG. 6 according to various aspects of the embodiments described herein.

FIG. 9 illustrates a portion of the cross-sectional view of the power module designated C-C in FIG. 6. The open terminal apertures 343-345 are shown in FIG. 9. The terminal apertures 343-345 form a number of openings through the housing 330. The terminal apertures 343-345 share a planar rim surface 351. The terminal apertures 343-345 also share an outer wall surface 355. Additionally, the terminal aperture 343 includes an inner wall surface 356, the terminal aperture 344 includes an inner wall surface 357, and the terminal aperture 345 includes an inner wall surface 358. Similar to the example shown in FIG. 8, the outer wall surface 355 and the inner wall surfaces 356-358 include transitional features.

The planar rim surface 351 is flat, planar, or substantially planar and is shared (i.e., extends continuously) between the terminal apertures 343-345. Thus, FIG. 8 illustrates an example in which three terminal apertures 343-345 share a common planar rim. The planar rim surface 351 is raised or offset from the exterior surface 332 of the housing 330. A height of the outer wall surface 355 can be measured from the exterior surface 332 of the housing 330 to the planar rim surface 351. The height of the outer wall surface 355 is selected to create an air gap between the exterior surface 332 of the housing 330 and a bottom surface of a PCB, which can be mounted on the housing 330 for electrical coupling to the power module 300. The height of the outer wall surface 355 can be the same as the height of the outer wall surface 354 (see FIG. 8). The height of the outer wall surfaces 354 and 355 can also be the same as that of the housing rim 360. Thus, when a PCB is mounted over the housing 330, it can seal (i.e., completely cover) the open terminal apertures 340-345 of the housing 330, and contact pads of the PCB can be electrically coupled to the terminal pins 320-322, among other terminal pins of the power module 300.

Figure 10A:
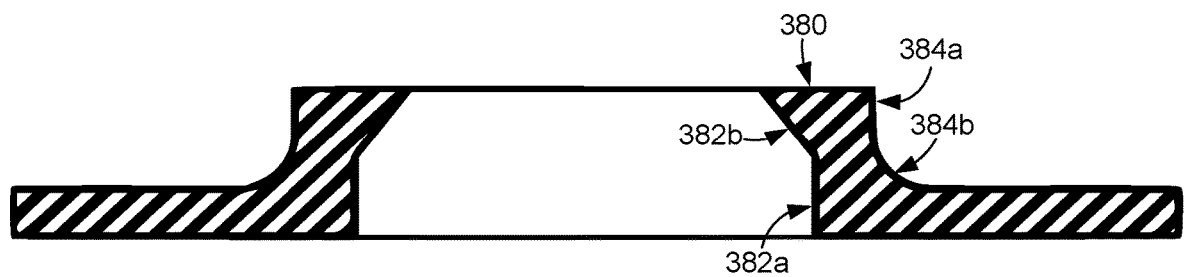
FIG. 10A illustrates a cross-sectional view of an example open terminal aperture according to various aspects of the embodiments described herein.
Figure 10B:
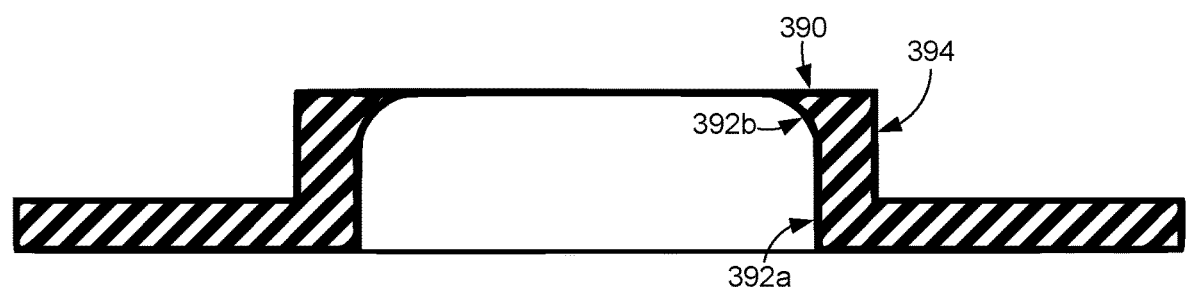
FIG. 10B illustrates a cross-sectional view of another example open terminal aperture according to various aspects of the embodiments described herein.
Figure 10C:
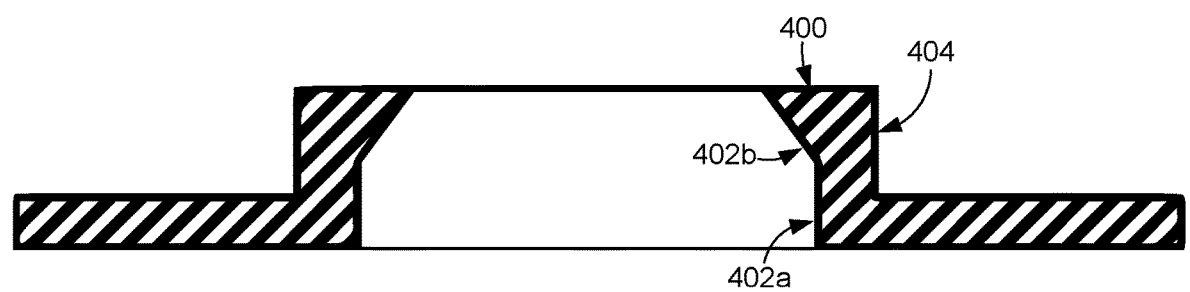
FIG. 10C illustrates a cross-sectional view of another example open terminal aperture according to various aspects of the embodiments described herein.

FIGS. 10A-10C illustrate cross-sectional views of other example open terminal apertures according to various aspects of the embodiments described herein. In FIG. 10A, the terminal aperture includes a planar rim surface 380. The planar rim surface 380 is flat, planar, or substantially planar. The terminal aperture also includes an inner wall surface, including a vertical inner surface 382a and an angled inner surface 382b. The vertical inner surface 382a extends perpendicular to the planar rim surface 380, and the angled inner surface 382b extends at an angle to the planar rim surface 380. As examples, the angled inner surface 382b can extend at an angle of between 80° to 60° as compared to the planar rim surface 380, such as at an angle of 80°, 78°, 76°, 74°, 72°, 70°, 68°, 66°, 64°, 62°, or 60°. The angled inner surface 382b can also extend at an angle of less than 60° as compared to the planar rim surface 380 in some cases, and even at an angle of less than 45° in some cases.

The outer wall surface includes a vertical outer surface 384a and a curved outer surface 384b. The vertical outer surface 384a extends perpendicular to the planar rim surface 380. The curved outer surface 384b includes a curved, semi-circular, or arced surface as compared to the vertical outer surface 384a and the planar rim surface 380. The angled inner surface 382b and the curved outer surface 384b help to reduce the intensity of the electric field in the area or region of the open terminal aperture shown in FIG. 10A.

In FIG. 10B, the terminal aperture includes a planar rim surface 390. The planar rim surface 390 is flat, planar, or substantially planar. The terminal aperture also includes an inner wall surface, including a vertical inner surface 392a and a curved inner surface 392b. The vertical inner surface 392a extends perpendicular to the planar rim surface 390, and the curved inner surface 392b includes a curved, semicircular, or arced surface as compared to the planar rim surface 390. The outer wall surface 394 also extends perpendicular to the planar rim surface 390.

In FIG. 10C, the terminal aperture includes a planar rim surface 400. The planar rim surface 400 is flat, planar, or substantially planar. The terminal aperture also includes an inner wall surface, including a vertical inner surface 402a and an angled inner surface 402b. The vertical inner surface 402a extends perpendicular to the planar rim surface 400, and the angled inner surface 402b extends at an angle to the planar rim surface 400. As examples, the angled inner surface 402b can extend at an angle of between 80° to 60° as compared to the planar rim surface 400, such as at an angle of 80°, 78°, 76°, 74°, 72°, 70°, 68°, 66°, 64°, 62°, or 60°. The angled inner surface 402b can also extend at an angle of less than 60° as compared to the planar rim surface 400 in some cases, and even at an angle of less than 45° in some cases. The outer wall surface 404 extends perpendicular to the planar rim surface 400.

FIGS. 10A-10C are representative examples of open terminal apertures including transitional features according to the embodiments. Other combinations of transitional features are within the embodiments, including outer or inner surfaces with combinations of vertical, angled, and curved surface segments. Additionally, a housing for a power module can include a combination of different open terminal apertures. For example, a single housing can include a combination of the terminal apertures shown in FIGS. 10A-10C, among others.

Thus, the concepts described herein offer a number of benefits to power modules. First, the open terminal apertures described herein include planar rim surfaces, and a PCB can be secured on and over the power module such that it seals and closes the open terminal apertures. The electrical connection for the transfer of power from the power module to a bus bar of the PCB is thus positioned within the open terminal aperture of the power module itself, rather than in an exposed area outside the housing, as with prior designs. The planar rim surface of the open terminal aperture can be raised up or offset from an exterior surface of the housing of the power module, to control the fit between the printed circuit board and the power module.

Additionally, the PCB can include one or more internal metal layers electrically coupled with the contact pad. The layers extend within the PCB to dislocate or more an intensity of the electric field away from the interface between the open terminal aperture of the power module housing and the PCB. In still other aspects, the open terminal apertures can include inner and outer wall surfaces with one or more transitional features. As examples, the transitional features can include angled or curved surfaces with respect to the planar rim of the open terminal aperture. The transitional features further help to abate or reduce the intensity of the electric field in the region of the open terminal aperture of the power module. With these improvements, among others, the central spacing between the electrical terminals of the power module can be significantly reduced.

The above-described examples of the present disclosure are merely possible examples of implementations set forth for a clear understanding of the principles of the disclosure. Many variations and modifications can be made without departing substantially from the spirit and principles of the disclosure. All such modifications and variations are intended to be included herein within the scope of this disclosure and protected by the following claims.

Therefore, the following is claimed:

1. A sealed interface for a power module, comprising:
    a printed circuit board comprising a contact pad for power conduction to a bus bar of the printed circuit board;
    a semiconductor module comprising at least one power transistor;
    a terminal pin electrically coupled to the power module; and
    a housing for the power module, the housing comprising an open terminal aperture that extends through the housing, wherein:
        the printed circuit board is seated upon the open terminal aperture, to close and seal the open terminal aperture, with the contact pad positioned within the open terminal aperture;
        the terminal pin contacts the contact pad of the printed circuit board within the open terminal aperture; and
        the open terminal aperture comprises a transitional feature to abate electric field intensity around an interface between the open terminal aperture and the printed circuit board.

2. The sealed interface for the power module according to claim 1, wherein the terminal pin comprises a spring for contact compression with the contact pad of the printed circuit board.

3. The sealed interface for the power module according to claim 1, further comprising:
    a plurality of terminal pins electrically coupled to the power module, wherein:
    the housing comprises a plurality of open terminal apertures that extend through the housing, with at least one of the plurality of terminal pins extending within each of the plurality of open terminal apertures.

4. The sealed interface for the power module according to claim 3, wherein:
    a voltage potential between two open terminal apertures among the plurality of open terminal apertures is at least 10,000 V; and
    a center-to-center spacing between two open terminal apertures among the plurality of open terminal apertures is about 6 mm.

5. The sealed interface for the power module according to claim 1, wherein:
    the open terminal aperture comprises a planar rim surface; and
    the planar rim surface is elevated from an exterior surface of the housing.

6. The sealed interface for the power module according to claim 5, wherein a planar surface of the printed circuit board is secured over and contacts the planar rim surface.

7. The sealed interface for the power module according to claim 5, wherein the transitional feature comprises at least one of a curved surface or an angled surface with respect to the planar rim surface.

8. The sealed interface for the power module according to claim 1, wherein the open terminal aperture comprises a planar rim surface, an inner wall surface, and an outer wall surface.

9. The sealed interface for the power module according to claim 8, wherein the inner wall surface comprises the transitional feature between an interior surface of the housing and the planar rim surface.

10. The sealed interface for the power module according to claim 8, wherein the outer wall surface comprises the transitional feature between an exterior surface of the housing and the planar rim surface.

11. The sealed interface for the power module according to claim 8, wherein:
the inner wall surface comprises a first transitional feature between an interior surface of the housing and the planar rim surface; and
the outer wall surface comprises a second transitional feature between an exterior surface of the housing and the planar rim surface.

12. The sealed interface for the power module according to claim 11, wherein:
the first transitional feature comprises an angled surface with respect to the planar rim surface; and
the second transitional feature comprises a curved surface with respect to the planar rim surface.

13. The sealed interface for the power module according to claim 1, wherein the printed circuit board comprises at least one internal metal layer electrically coupled with the contact pad and extending within the printed circuit board to dislocate electric field intensity away from the interface between the open terminal aperture and the printed circuit board.

14. A power module, comprising:
a semiconductor module comprising at least one power transistor;
a terminal pin electrically coupled to the power module; and
a housing for the power module, the housing comprising an open terminal aperture that extends through the housing, wherein:
the terminal pin extends within the open terminal aperture; and
the open terminal aperture comprises a transitional feature to abate electric field intensity around the open terminal aperture.

15. The power module according to claim 14, further comprising:
a plurality of terminal pins electrically coupled to the power module, wherein:
the housing comprises a plurality of open terminal apertures that extend through the housing, with at least one of the plurality of terminal pins extending within each of the plurality of open terminal apertures.

16. The power module according to claim 14, wherein:
the open terminal aperture comprises a planar rim surface; and
the planar rim surface is elevated from an exterior surface of the housing.

17. The power module according to claim 14, wherein the transitional feature comprises at least one of a curved surface or an angled surface with respect to the planar rim surface.

18. The power module according to claim 14, wherein the open terminal aperture comprises a planar rim surface, an inner wall surface, and an outer wall surface.

19. The power module according to claim 18, wherein the inner wall surface comprises the transitional feature between an interior surface of the housing and the planar rim surface.

20. The power module according to claim 18, wherein the outer wall surface comprises the transitional feature between an exterior surface of the housing and the planar rim surface.

\* \* \* \* \*